(12) United States Patent
Ganghofer et al.

(10) Patent No.: US 7,868,273 B2
(45) Date of Patent: Jan. 11, 2011

(54) MICROWAVE GENERATOR

(75) Inventors: Andreas Ganghofer, Röthenbach (DE); Jürgen Urban, Erlangen (DE); Geoffrey Staines, San Diego, CA (US)

(73) Assignee: Diehl BGT Defence GmbH & Co., Überlingen (DE)

( * ) Notice: Subject to any disclaimer, the term of this patent is extended or adjusted under 35 U.S.C. 154(b) by 1121 days.

(21) Appl. No.: 11/581,824

(22) Filed: Oct. 17, 2006

(65) Prior Publication Data

US 2007/0085618 A1    Apr. 19, 2007

(30) Foreign Application Priority Data

Oct. 17, 2005   (DE) .................. 10 2005 049 538

(51) Int. Cl.
*H05B 6/64*   (2006.01)
*H02H 1/00*   (2006.01)
*H02M 3/06*   (2006.01)

(52) U.S. Cl. .................. 219/678; 361/128; 315/39; 307/109

(58) Field of Classification Search .................. 219/678, 219/680; 361/128; 307/100, 106, 108, 109, 307/110; 315/39, 111.41, 4, 111.4, 1.4; 313/567; 331/96, 127, 169
See application file for complete search history.

(56) References Cited

U.S. PATENT DOCUMENTS 4,329,686 A   5/1982   Mourou 6,337,660 B1   1/2002   Esman et al.
6,768,458 B1   7/2004   Green et al.
6,822,394 B2   11/2004   Staines et al.
7,002,300 B2   2/2006   Urban et al.
2004/0190214 A1   9/2004   Dommer et al.

FOREIGN PATENT DOCUMENTS

DE   40 25 852 A1   8/1990
DE   103 13 286 B3   3/2003

*Primary Examiner*—Quang T Van
(74) *Attorney, Agent, or Firm*—Scully, Scott, Murphy & Presser, P.C.

(57) ABSTRACT

In order to make it possible to direct sufficient microwave energy at a target with an electronic device which is to be interfered with or to be destroyed, the beams (7) from at least two antenna arrays (10) are focused on an effective area (8) in the vicinity of that target, preferably from a vehicle (3) which is equipped with these arrays (10). For effective super-imposition of the emitted microwave energy (7) in the emission direction of in each case one of the arrays (10), the use of an arc for discharging the capacitance (43) of the resonator via its spark gap (13) is observed, and is recorded quasi-continuously optoelectronically. The electrode separation of the spark gap (13) or the fluid pressure of the dielectric in the vicinity of the spark gap (13) is then varied by control elements such that all of the spark gaps (13) in an array (10) ignite virtually at the same time, so that their discharge current pulses which lead to the emission of the microwave energy (7) start virtually in phase.

8 Claims, 2 Drawing Sheets

MICROWAVE GENERATOR

BACKGROUND OF THE INVENTION

1. Field of the Invention

The present invention relates to a multiple microwave generator in the form of an array of antennas which are connected to the respective inner electrode of capacitive, coaxial resonators.

2. Discussion of the Prior Art

The array of antennas is intended to emit a high-energy microwave field as soon as the resonators (which, for example, are charged to a high voltage via a Marx generator) are discharged via spark gaps, in order to have an interfering or destructive influence on a target, in particular on its electronic circuits for communication and data purposes. In an array such as this, the emitted fields are superimposed to produce a greater effect and a greater operating range in the superimposition direction, but only when the spark gaps are ignited synchronously in time. The unavoidable stochastic responses of spark gaps are admittedly negligible for the influence of such superimpositions—but not systematic effects such as the delay time influences of different line lengths and the lengthening of spark gaps as a result of different electrode wear during operation. This results in the antennas of such arrays in practice soon no longer having current passed through them synchronously from the capacitor discharges but at times which differ increasingly from one another, despite originally being matched to a synchronous response of the spark gaps, thus leading to the fields no longer being superimposed in phase. However, using instrumentation means that are available for practical requirements, all that it is possible to tell is that the antennas in the array are stimulated on the basis of the respective spark gap flashover. However, when it is not possible to detect any radiation density, in particular any increased radiation density, at a specific distance in front of this antenna array, then this can only be because the spark gaps have ignited without being synchronized.

SUMMARY OF THE INVENTION

Based on knowledge of these circumstances, the present invention is based on the solving of the technical problem of improving the effect on the target of the microwave energy emitted from antenna arrays such as these.

According to the invention, the feature, as described and claimed herein, solves this problem. The invention provides for the ignition response of the individual resonator spark gaps in this antenna array to be varied individually until the spark gaps respond at the same time. In the context of the present invention, the same response means that the capacitive discharge currents for feeding their antennas start at the same time for all of the resonators which are operated in parallel. This then results in the current starting at the same time with a steep rising flank in all of the antennas before its oscillating decay. Owing to this constructive superimposition, so to speak, all of the antennas are then operated in phase in the desirable manner, to be precise synchronized in time in order to emit microwave energy, which leads to a measurable intensity superimposition, that is to say to a greater effective range, in the far field.

In order to deliberately vary the response of the respective spark gaps, their electrodes can be mechanically adjustable relative to one another, for example as sketched in an exemplary form in the main patent, by means of threaded bolts, which can be screwed to a greater or lesser depth into the base of an outer electrode, which is in the form of a pot, in the direction of the apex of the convex base of an inner electrode, which is in the form of a bottle, of the resonator. This inward and outward screwing is expediently carried out by means of a control motor so that there is no need for any manual operation in the high-voltage area of the resonators. Other control systems can also be used advantageously here, for example piezo-actuators in series with the electrodes. In the case of pneumatic adjustment, which can be implemented at particularly low cost, a piston with an adjustable electrode is moved by means of a variable fluid pressure against the holding force of a restoring spring.

In order to deliberately influence the response of the spark gap of the respective resonator, in the interest of superimposition in time of the start of the energy contributions which are emitted in a pulsed form, it is possible in addition to variation of the distance between the spark-gap electrode, or instead of this, to also provide for the fluid pressure of the dielectric medium in the area between the two electrodes to be varied, for example by building up a higher pressure by means of a pump in the respective resonator or to decrease the pressure by means of a discharge valve in the respective resonator.

Reducing the electrode separation or reducing the dielectric pressure between the electrodes leads to the spark gap flashing over earlier in the course of the charging of the resonator capacitance to the high output voltage of a Marx generator, and thus in the current flow to the antenna starting earlier.

However, one remaining problem is still how to use instrumentation to detect which of the spark gaps in an array is igniting too early and which is igniting too late with respect to the desirable, exact time superimposition of the start of the emission of microwave energy. This cannot be detected precisely by the normal in-field instruments used in radio-frequency technology, because they respond to the power of the emitted spectrum. It is therefore not possible to use a field probe to measure the response of an individual antenna from the array, and the measurement of superimposed fields by means of the probe leads to blurring of the pulse forms of the individual antenna contributions in time. One development of the present additional invention therefore provides for the occurrence of the light flash when the respective spark gap is ignited to be detected optoelectronically, and for the time intervals which occur in this case to be evaluated. For this purpose, a detector can be fitted close to the spark gap between the inner and outer electrode in the resonator. However, it is more expedient to allow an optical fibre to end here, which is connected to the optoelectronic detector only downstream from the spark gap and thus in the electromagnetically less interference-critical surrounding area. This produces an output voltage which rises steeply with the start of the ignition flash of the spark gap. The voltage profiles coming from the individual spark gaps can be displayed in parallel on a multichannel oscilloscope in order to determine the sequence and the time offset with which the individual spark gaps in the antenna array respond. As mentioned above, the fluid pressures and/or the electrode separations in the individual resonators can then be varied to ensure that the spark gap flashovers start as synchronously as possible, thus leading to the emissions from the antennas in the array being superimposed in the correct phase on one another in the far field.

However, an oscilloscope display such as this can essentially be used sensibly only in a laboratory. For practical requirements, it would be desirable to be able to monitor and to readjust the time of the start of the discharge spark between the electrodes of the capacitive resonator at shorter intervals or even virtually continuously, depending on the instantaneous environmental influences. It is then possible, for example, to arrange in each case one such antenna array, for example in the area of the front headlights of a security vehicle and to aim them in front at such an acute mutual angle that the always optimized antenna emissions are made to produce a superimposed effect at one point in front of each of the arrays, specifically as a result of electromagnetic overdriving as a consequence of the superimposed field strengths of the two more intensive directional beams, for example in order to interfere with or even to destroy the ignition electronics of a mine, of an explosive trap or of the input circuit of a communication device.

According to one development of the present invention, during operation of the antenna arrays, the arrangement of the optoelectronic detectors for monitoring the start of the ignition sparks in the arrays is in each case switched to a time measurement device which is also carried and by means of which the mutual time interval between the start of the ignition spark in the respective array is measured in parallel on a plurality of channels. These time measurement values are converted in a control circuit to manipulated variables for variation, in particular by means of an electric motor or motors, of the ignition electrode separation and/or of the fluid pressure in the respective resonator of an array, until the start of the discharge to the respective antenna is coordinated in time. These measurements and the spark gap adjustments which result from them can now be carried out during operation of an array for high-energy microwave emission, so that iterative energy optimization can be carried out even while approaching a safety or security-critical area.

BRIEF DESCRIPTION OF THE DRAWINGS

With regard to additionally inventive alternatives and developments as well as their advantages, reference is made to the following description of the preferred exemplary embodiment, which is illustrated in a highly abstracted form in the drawing, which is restricted to what is essential, to the solution according to the invention. In the drawing.

DETAILED DESCRIPTION OF THE INVENTION

Figure 2:
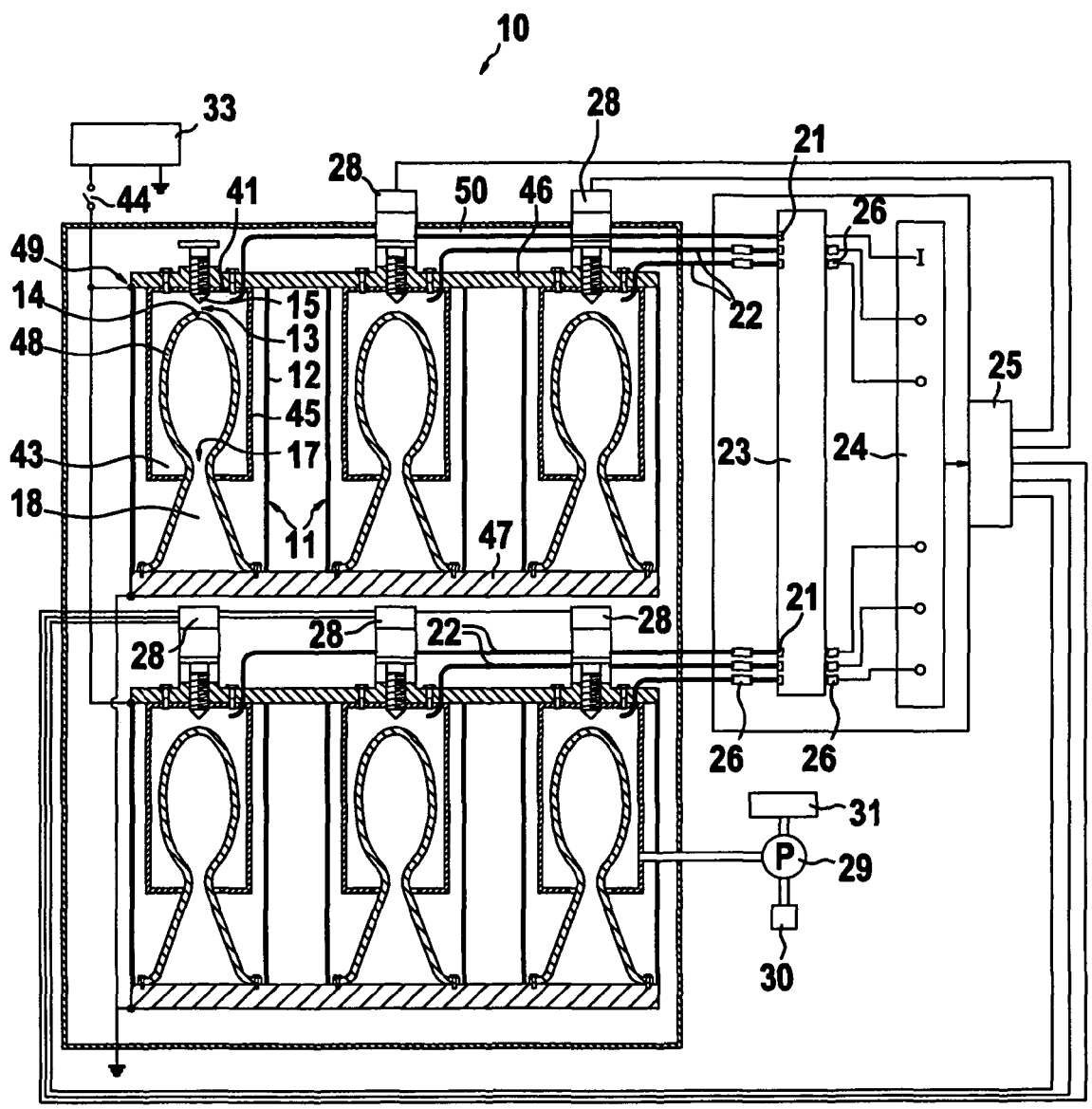
FIG. 2 shows a front view of one of the arrays shown in FIG. 1, equipped with an optoelectronic input coupling of a measurement device for the time offset of the response of its spark gaps, and with a control device for variation of the response of individual spark gaps, taking into account two different options for influencing the response.

In order to focus high-energy microwave radiation 7 on an effective area 8 in front, for example, of a monitoring platform which can be deployed on the land, in the air or at sea, referred to for simplicity in the following text as a vehicle 9, two arrays 10 are mounted on the vehicle 9 in this preferred exemplary embodiment, for example on both sides in front of the radiator grille. Each of the two arrays 10 as shown in FIG. 2 comprises a plurality of microwave generators 11. In a hollow-cylindrical housing 12 composed of electrically insulating material, these microwave generators 11 have a coaxial spark gap 13 between an electrode 14, which is in the form of a spherical cap, and an electrode 15 which in contrast is pointed. This spark gap 13 is the arc discharge path for the capacitance which is charged to the breakdown voltage of a coaxial resonator, whose outer electrode 45 is connected to the pointed electrode 15, while the convex arc electrode 14 is part of a hollow inner conductor 48 in the form of a bottle. Within the housing 12, the narrowed area 17 of this inner conductor 48, which is in the form of a bottleneck and emerges from the outer electrode 45 opposite the spark gap 13, is adjacent to the small base of an antenna 18 which has a hollow truncated conical shape with an acute angle. This funnel shape results in this antenna 18 acting as an impedance converter for the emission of a radio-frequency mixture when the capacitance 43 (which has been charged to high voltage) of the microwave resonator is short-circuited via the spark gap 13 in order to discharge into the antenna 18.

The pointed electrode 15, which passes through the base 41 of the resonator, is, as sketched, in the form of a threaded bolt with a fine-pitched thread, by means of which the unobstructed length of the spark gap 13 can be varied in fine steps in order to appropriately influence the breakdown field strength. The spark gap 13 responds when the capacitance 43 has been sufficiently charged from a high-voltage source 33 via a switching path 44, with the high-voltage source 33 preferably being a capacitor bank with switching measures in the form of a Marx voltage-impulse circuit. The discharging of the capacitance 43 which is started by the discharge spark across the gap 13 leads to a steeply rising current flow, which then decays in a highly oscillating form, in the antenna 18, and this is emitted as a high-energy microwave mixture starting in a correspondingly steep manner.

As can be seen from FIG. 2, a plurality of such microwave generators 11 are mechanically held in the form of rows and columns in the front of an electrically conductive screening surface 50 by means of electrically conductive brackets 46, with their capacitances 43 connected in parallel, and are electrically connected in parallel to the antenna array 10. When all of the spark gaps 13 in an array 10 such as this respond at the same time, the antennas 18 emit spectra which start essentially in phase and are then superimposed in the correct phase in the direction transversely with respect to the plane of the plate 50, therefore leading to an increase in the effective range of a high-energy beam 7 in the microwave spectrum. The distance between the antennas 18 and the electrically reflective screening surface 50 influences the effective spectral median in the emitted microwave spectrum comprising the superimposition of the contributions from the individual antennas 18. However, an effective energy superimposition effect is dependent, as already stated, on the emitted pulses starting at the same time and thus on the discharge arcs across the spark gaps 13 starting at the same time. However, this is not ensured without problems simply by virtue of the atmospheric and design characteristics in the vicinity of the spark gap 13, and also because the charging paths, which are of different lengths, from the high-voltage feed 49 via the brackets 46/47 act as different inductances and, as a consequence of different charging time constants, lead to charging delays in those resonators which are further away from the feed 49. This factor on its own justifies efforts to ensure that all the lines are of the same length, in order to avoid large systematic time errors; however, the fine tuning of the spark gaps with respect to one another by means of optoelectronic spark detection is also subject to unavoidable manufacturing tolerances, thermal effects and wear phenomena.

In order to use instrumentation to detect the start of the discharge of the respective resonator capacitance 43 via the spark gap 13 into the antenna 18, each spark gap 13 in the array 10 has an associated optoelectronic detector 21. According to the sketched preferred implementation example, this is connected via an optical fibre 22 to the immediate vicinity of the spark gap 13. The output voltages from the detectors 21 are amplified in a pre-processing circuit 23. A trigger signal is then in each case obtained from the rising pulse flank of the amplified signal; preferably by the use of a constant fraction trigger (CFT) to the rising pulse flank, as described by way of example for a different application in DE 1 00 26 534 A1. These trigger signals which are associated with the individual spark gaps are used to drive the channels of a plurality of two-channel counters which are connected in parallel with one another, or of a four-channel timer 24. The timer supplies a digital value, relating to the relative time of response of one spark gap 30 with respect to the other spark gaps 13 in this array 10, to a control circuit 25 for each channel of the timer 24, and thus for each spark gap 13 in the array 20.

A delay 26 is provided for each measurement channel, in order to ensure that the timer 24 starts in a defined manner for this measurement. If the delay 26 is located upstream of the pre-processing circuit 23, it is expediently formed by the length of the optical fibre 22; in contrast, a delay 26 acting downstream from the pre-processing circuit 23 is expediently produced by circuitry. These delays 26 are not just provided for a single one of the spark gaps 13 which are detected from an array 10 by a counter 24. The measurement channel which is associated with this antenna 18 or this spark gap 13 can be referred to as a master, because the ignition times of all the other channels are matched to it. This is because the delay, which does not exist in the case of the master, signals the detection of light appearing from the discharge sparks for this one spark gap 13 in any case earlier than that of all the others (delayed) with respect to the timer 24, so that the timer 24 is reliably started before (now with respect to this reference time) the stop signals arrive from channels associated with other spark gaps 13. The switching response of the individual spark gaps 13 is then influenced in such a way that the individual time intervals tend as far as possible to zero with respect to the starting moment of the timer 24, because the steep initial flanks of the microwave emission from the individual antennas 18 then optimally start at the same time.

In order to advance the start of the discharge of a microwave resonator capacitance 43 which is too late with respect to the master, that is to say the starting moment of the timer 24, the unobstructed distance between its spark gap electrodes 14-15 can be reduced, or the pressure of the fluid dielectric in the interior of the resonator can be reduced—and vice versa. As is shown in FIG. 2, the first-mentioned option can be achieved by using a motor to rotate the pointed electrode 15, which is in the form of the bolt 27 that has been screwed through the resonator base 42. It is equipped with a miniaturized transmission motor 28 for this purpose which is driven on the basis of the delay time measurement result from the associated time measurement channel via the control circuit 25 in order to vary the response time of the spark gap 13 by variation of its length—with respect to the undelayed spark gap 13 (at the top on the left in FIG. 2) which is not equipped with any such control device and therefore acts as a reference. If the electrode 15 is not screwed in place but is held by sliding friction, it can be moved with respect to the opposing electrode 14 by means of the linear motor mentioned above (with a fluid or piezo control element).

At the bottom on the right, FIG. 2 takes account of the fact that, instead of this or in addition, a pump motor 29 or a pressure-relief valve 30 can also be operated from the control circuit 25, in order to increase the pressure of the fluid dielectric in the vicinity of the spark gap 13 and thus between the inner electrode 48 and the outer electrode 45 of the capacitive resonator 43 from a supply container 31, or to reduce it via the valve 30.

Figure 1:
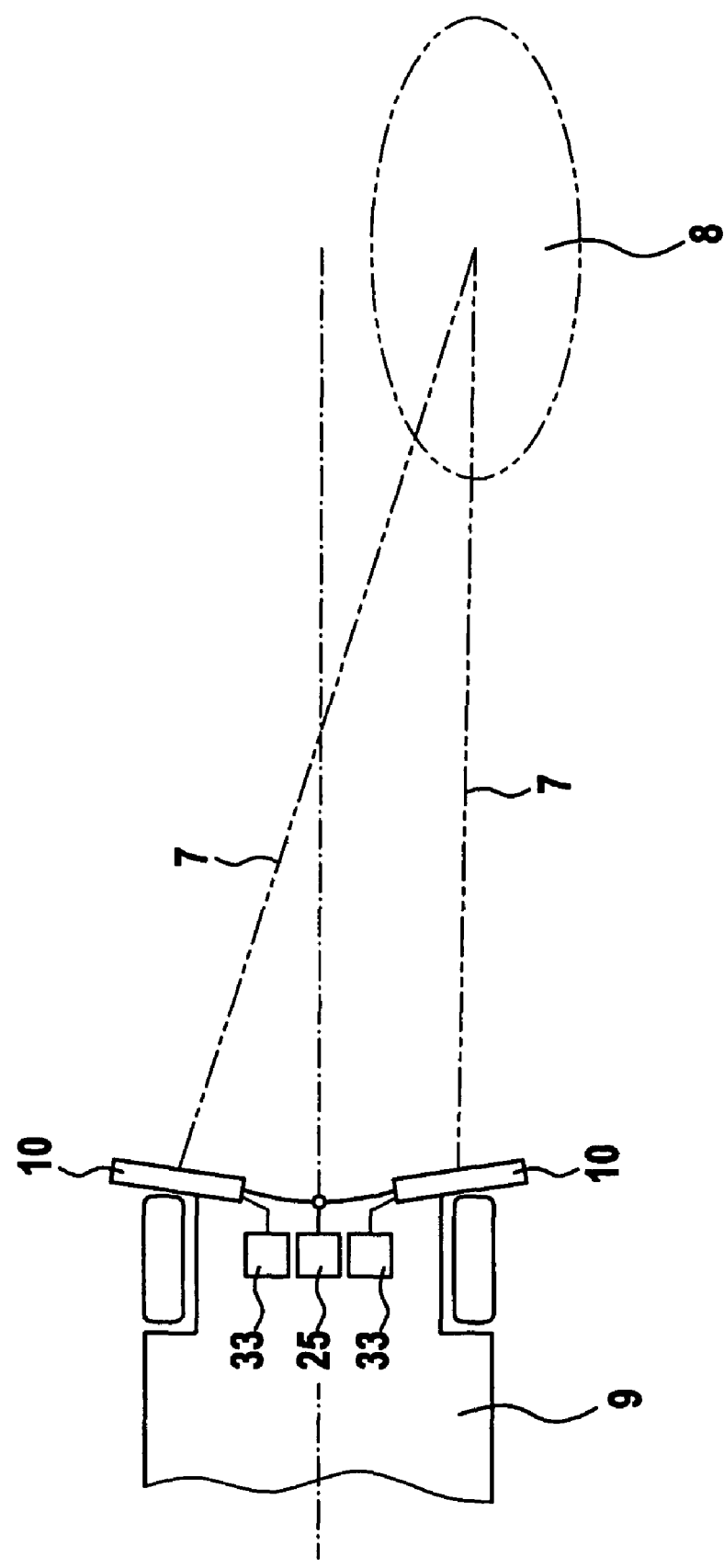
FIG. 1 shows a plan view of a monitoring vehicle with two microwave arrays mounted in front of its radiator grille, whose emissions are focused on a comparatively closely delineated area at a relatively long distance to the side and in front of the vehicle.

In order to make it possible to direct sufficient microwave energy at a target which has an electronic device that is to be interfered with or destroyed, that is to say according to the invention to focus the beams 7 from at least two antenna arrays 10 on an effective area 8 in the vicinity of that target, preferably from a vehicle 9 or similar platform which is equipped with these arrays 10, with effective superimposition of the emitted microwave energy 7 in the emission direction of in each case one of the arrays 10 as well as of the arrays 10-10 with respect to one another, the start of the arc for discharging the capacitance 43 of the resonator via its spark gap 13 is observed, and is detected virtually continuously by optoelectronic means. In this case, the superimposition area 8 can be scanned and, as shown in FIG. 1, can be directed in particular at a side strip alongside the vehicle path, when a defined delay is set in the successive excitation of the two arrays 10-10. In order to set the ignition time, the electrode separation of the spark gap 13 and/or the fluid pressure of the dielectric in the vicinity of the spark gap 13 are/is varied, as mentioned, for example by means of motor control elements such that all of the spark gaps 13 in one array 10 are ignited virtually at the same time or else (for beam scanning) with a defined offset with respect to one another, so that their discharge current pulses, which lead to the emission of the microwave energy 7, start in a phase-controlled manner.

What is claimed is:

1. A microwave generator (11) with a short-circuit spark gap (13) between electrodes (48, 45) of a capacitive microwave resonator (43) thereof, which is terminated at an antenna (18), and a plurality of said antennas being operated in parallel as an antenna array (10), wherein the spark gaps (13) are settable to provide the same time response; a plurality of optoelectronic detector (21) being provided for setting the time at which a spark gap (13) responds; said detectors (21) being connected to a multichannel timer (24); and wherein the timer (24) in each channel, except for one channel, is driven with a delay (26) which is located before or after the detectors (21).

2. A microwave generator according to claim 1, wherein the detector (21) is connected at a close vicinity of the spark gap (13) in the resonator (43) via an optical fibre (22).

3. A microwave generator according to claim 1, wherein the delay (26) is provided by means having the length of the optical fibre (22) extending from the detector (21) to the spark gap (13).

4. A microwave generator according to claim 1, wherein the circuitry for the delay (26) is arranged between the detector (21) and the timer (24).

5. A microwave generator according to claim 1, wherein a control circuit (25) is provided in order to influence the response of the spark gap (13) as a function of the result of the timer (24) for said channel.

6. A microwave generator according to claim 5, wherein the spark gap (13) is equipped with an electrode (15) which is adjustable by a control element (motor 28).

7. A microwave generator according to claim 5, wherein the pressure of a fluid dielectric in the vicinity of the spark gap (13) is variable via a pump motor (29) and/or via a valve (30).

8. A microwave generator according to claim 1, wherein the microwave generator is arranged in a duplicated form in the front area of a platform (vehicle 9), with emissions (7) of said generators being superimposed on one another in an effect area (8) centrally or at the side in front thereof.

* * * * *